United States Patent
Liu et al.

(10) Patent No.: US 11,201,301 B2
(45) Date of Patent: Dec. 14, 2021

(54) BASE SUPPORT PLATE AND METHOD OF MANUFACTURING THE SAME, AND METHOD OF MANUFACTURING A FLEXIBLE DISPLAY PANEL

(71) Applicant: BOE TECHNOLOGY GROUP CO., LTD., Beijing (CN)

(72) Inventors: Zhen Liu, Beijing (CN); Hua Huang, Beijing (CN); Wei Huang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/392,303

(22) Filed: Apr. 23, 2019

(65) Prior Publication Data

US 2019/0334103 A1 Oct. 31, 2019

(30) Foreign Application Priority Data

Apr. 26, 2018 (CN) .......................... 201810386988.8

(51) Int. Cl.
*H01L 51/00* (2006.01)
*H01L 27/32* (2006.01)
*H01L 51/56* (2006.01)

(52) U.S. Cl.
CPC ...... *H01L 51/0097* (2013.01); *H01L 27/3244* (2013.01); *H01L 51/003* (2013.01); *H01L 51/56* (2013.01); *H01L 2227/326* (2013.01); *H01L 2251/5338* (2013.01)

(58) Field of Classification Search
None
See application file for complete search history.

(56) References Cited

U.S. PATENT DOCUMENTS

2004/0171262 A1* 9/2004 Takayama ........... H01L 27/1214
438/691
2013/0328071 A1 12/2013 Tanaka
2015/0060870 A1 3/2015 Ro et al.

FOREIGN PATENT DOCUMENTS

CN 204464252 U 7/2015
CN 107958921 A 4/2018

OTHER PUBLICATIONS

CN 204464252 U. Machine translation provided (Year: 2015).*
https://refractiveindex.info/?shelf=main&book=Si3N4&page=Luke, Refractive index of Silicon Nitride (Year: 2021).*
https://refractiveindex.info/?shelf=main&book=Cr&page=Johnson, Refractive index of Chromium (Year: 2021).*
Second Office Action issued in Chinese Application No. 201810386988.8, dated Jun. 22, 2020, with English language translation.
First Office Action issued in Chinese Application No. 201810386988.8, dated Dec. 18, 2019, with English translation.

* cited by examiner

*Primary Examiner* — Andres Munoz
(74) *Attorney, Agent, or Firm* — McDermott Will and Emery LLP (57) ABSTRACT

A base support plate includes a support plate body. A support surface of the support plate body is configured to support a flexible base of a flexible display panel. The base support plate further includes a plurality of micro-structures disposed on the support surface of the support plate body, and the plurality of micro-structures are configured to diffuse incident light and transmit the incident light to the flexible base.

11 Claims, 6 Drawing Sheets

BASE SUPPORT PLATE AND METHOD OF MANUFACTURING THE SAME, AND METHOD OF MANUFACTURING A FLEXIBLE DISPLAY PANEL

CROSS-REFERENCE TO RELATED APPLICATION

This application claims priority to Chinese Patent Application No. 201810386988.8, filed with the Chinese Patent Office on Apr. 26, 2018, titled "BASE SUPPORT PLATE AND METHOD OF MANUFACTURING THE SAME, AND METHOD OF MANUFACTURING A FLEXIBLE DISPLAY PANEL", which is incorporated herein by reference in its entirety.

TECHNICAL FIELD

The present disclosure relates to the field of display technologies, and in particular, to a base support plate and a method of manufacturing the same, and a method of manufacturing a flexible display panel.

BACKGROUND

With a continuous development of display technologies, flexible displays are widely used as deformable and flexible display devices made of a soft material.

SUMMARY

In one aspect, a base support plate is provided. The base support plate includes a support plate body, and a support surface of the support plate body is configured to support a flexible base of a flexible display panel. The base support plate further includes a plurality of micro-structures disposed on the support surface of the support plate body, and the plurality of micro-structures are configured to diffuse incident light and transmit the incident light to the flexible base.

In some embodiments, the base support plate further includes a planarization layer covering the plurality of micro-structures and portions of the support surface on which no micro-structures are located. A surface of the planarization layer facing away from the support plate body is configured to be in contact with the flexible base.

In some embodiments, the flexible base includes one or more thin film layers, and a material of the planarization layer is configured to be different from a material of the thin film layer in the flexible base to be in contact with the planarization layer.

In some embodiments, a refractive index of the planarization layer is less than a refractive index of the plurality of micro-structures.

In some embodiments, the refractive index of the plurality of micro-structures is less than or equal to a refractive index of the support plate body.

In some embodiments, an absolute value of a difference between the refractive index of the planarization layer and the refractive index of the plurality of micro-structures is in a range of 0.1 to 0.5.

In some embodiments, the plurality of micro-structures and the support plate body are integrally formed.

In some embodiments, the plurality of micro-structures constitute a one-dimensional grating.

In some embodiments, the plurality of micro-structures are arranged in an array.

In some embodiments, each of the plurality of micro-structures includes a cylinder or a cube.

In some embodiments, the support plate body includes a glass support plate.

In another aspect, a method of manufacturing a base support plate is provided. The method of manufacturing the base support plate includes: forming a plurality of micro-structures on/in a support surface of a support plate body configured to support a flexible base of a flexible display panel; and forming a planarization layer on the support surface provided with the plurality of micro-structures.

In some embodiments, forming the plurality of micro-structures on/in the support surface of the support plate body includes: forming the plurality of micro-structures on/in the support surface of the support plate body through a patterning process. The patterning process includes a nanoimprint process or a photoetching process.

In some embodiments, forming the plurality of micro-structures on/in the support surface of the support plate body includes: forming a one-dimensional grating on/in the support surface of the support plate body; or forming a plurality of cylindrical micro-structures or a plurality of cubic micro-structures arranged in an array on/in the support surface of the support plate body.

In some embodiments, forming the planarization layer on the support surface provided with the plurality of micro-structures includes: forming a planarization layer on the support surface provided with the plurality of micro-structures through a film forming process by using a light-transmissive material different from a material of a thin film layer in the flexible base configured to be in contact with the base support plate.

In some embodiments, forming the planarization layer on the plurality of micro-structures and the support surface includes: forming a planarization layer the support surface provided with the plurality of micro-structures by using a light-transmissive material having a refractive index less than a refractive index of the plurality of micro-structures.

In another aspect, a method of manufacturing a flexible display panel is provided. The method of manufacturing the flexible display panel includes: manufacturing a base support plate by using the method of manufacturing the base support plate described above; forming a flexible display panel on a surface of the planarization layer in the base support plate facing away from the support plate body; and incidenting a laser beam from a side of the support plate body facing away from the planarization layer to separate the base support plate from the flexible display panel.

In some embodiments, forming the flexible display panel on the surface of the planarization layer in the base support plate facing away from the support plate body includes: forming a flexible base on the surface of the planarization layer in the base support plate facing away from the support plate body; and forming a pixel array on a surface of the flexible base facing away from the planarization layer.

In some embodiments, forming the flexible base on the surface of the planarization layer in the base support plate facing away from the support plate body includes: forming a first organic thin film layer, a first inorganic thin film layer, a second organic thin film layer and a second inorganic thin film layer on the surface of the planarization layer facing away from the support plate body in sequence through a film forming process.

In some embodiments, materials for manufacturing the first organic thin film layer and the second organic thin film layer include polyimide. Materials for manufacturing the first inorganic thin film layer and the second inorganic thin film layer include at least one of silicon oxide or silicon nitride.

BRIEF DESCRIPTION OF THE DRAWINGS

In order to describe technical solutions in embodiments of the present disclosure more clearly, the accompanying drawings to be used in the description of disclosure will be introduced briefly. Obviously, the accompanying drawings to be described below are merely some embodiments of the present disclosure, and a person of ordinary skill in the art can obtain other drawings according to these drawings without paying any creative effort.

DETAILED DESCRIPTION

The technical solutions in some embodiments of the present disclosure will be described clearly and completely with reference to the accompanying drawings in some embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

The terms "first" and "second" are used for descriptive purposes only and are not to be construed as indicating or implying the relative importance or implicitly indicating the number of indicated technical features below. Thus, features defined as "first", "second" may explicitly or implicitly include one or more of the features. In the description of the present disclosure, "plurality" means two or more unless otherwise specified.

In a process of manufacturing a flexible display panel, it is usually required to manufacture a flexible base on a substrate, then manufacture a body member of the flexible display panel on a surface of the flexible base facing away from the substrate, and finally separate the flexible base from the substrate by using a laser lift-off technique, thereby obtaining a manufactured flexible display panel. However, in the process of separating the flexible base from the substrate by using the laser lift-off technique, due to a non-uniformity of laser pulses, thin film transistors (TFTs) in the body member of the flexible display panel are easy to receive a laser beam non-uniformly, which causes that performances of the TFTs are not uniform, thereby causing an abnormal display of the flexible display panel.

Figure 1:
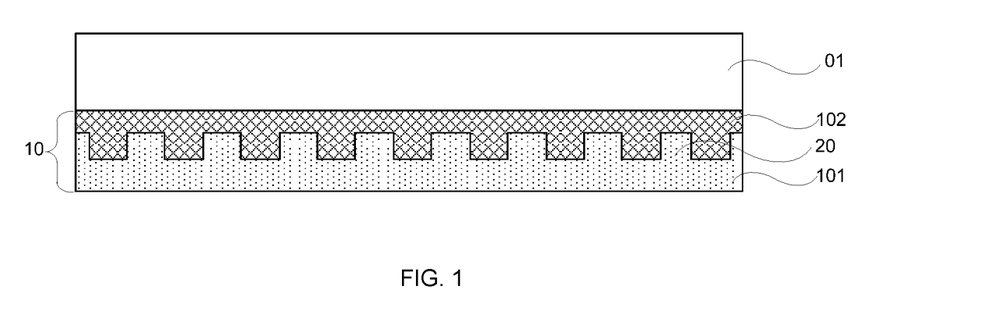
FIG. 1 is a schematic diagram of a base support plate on which a flexible base is supported, in accordance with some embodiments.

Based on this, with reference to FIG. 1, some embodiments of the present disclosure provide a base support plate 10. The base support plate 10 includes a support plate body 101, and a support surface of the support plate body 101 is configured to support a flexible base 01 of a flexible display panel.

In some examples, the description that the support surface of the support plate body 101 is configured to support the flexible base 01 of the flexible display panel does not mean that the support surface of the support plate body 101 is in direct contact with the flexible base 01, that is, other thin films can be provided between the support surface of the support plate body 101 and the flexible base 01. The support surface of the support plate body 101 is a surface of the support plate body 101 close to the flexible base 01 after the flexible base 01 is supported by the base support plate 10.

In some embodiments, the support plate body 101 is made of a rigid light-transmissive material. The support plate body 101 is, for example, a glass support plate or a support plate made of a hard transparent resin material. Some embodiments of the present disclosure do not limit the material for manufacturing the support plate body 101, as long as the material for manufacturing the support plate body 101 can ensure that the support plate body 101 has a certain rigidity, and that the support plate body 101 may support the flexible base 01 and the body member of the flexible display panel manufactured on the flexible base 01 in the process of manufacturing the flexible display panel.

In addition, the body member of the flexible display panel usually includes a pixel array and external leads disposed corresponding to the pixel array. Each pixel of the pixel array includes a light-emitting device and a pixel circuit coupled to the light-emitting device. Each pixel circuit includes at least one TFT, and is configured to drive a corresponding light-emitting device to emit light. The body member of the flexible display panel further includes an encapsulation film layer or a cover plate or the like configured to encapsulate the pixel array.

For example, the light-emitting device includes an organic light-emitting diode (OLED) or a light-emitting diode (LED), which some embodiments of the present disclosure do not limit.

Figure 4:
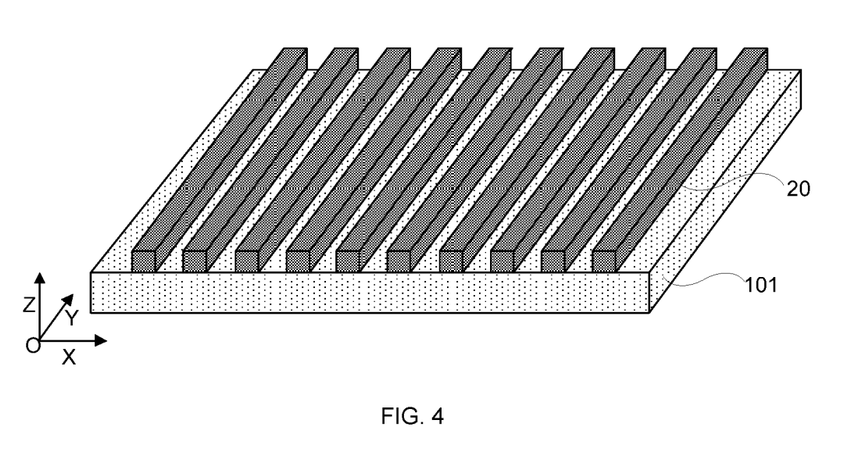
FIG. 4 is a schematic diagram showing a plurality of micro-structures, in accordance with some embodiments.
Figure 5:
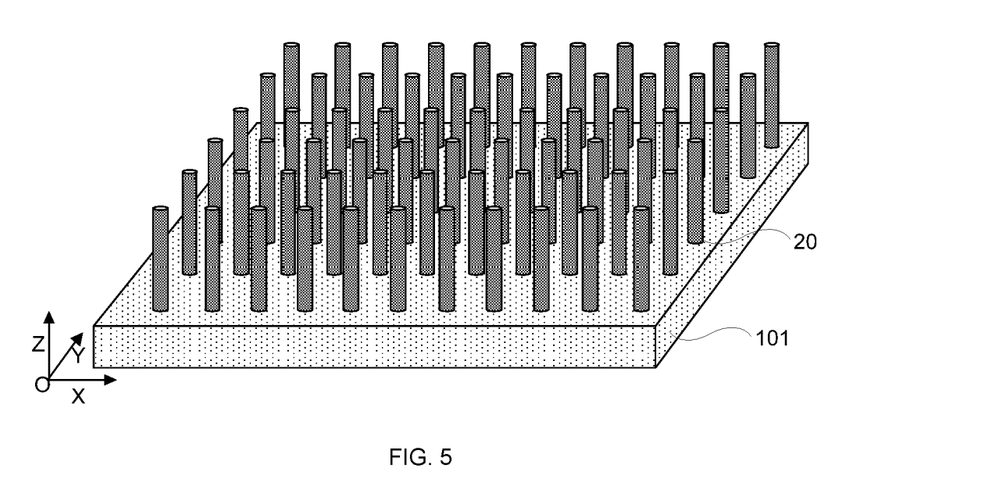
FIG. 5 is a schematic diagram showing a plurality of micro-structures, in accordance with some embodiments.

With reference to FIGS. 1, 4 and 5, in some embodiments, the base support plate 10 further includes a plurality of micro-structures 20 disposed on the support surface of the support plate body 101, and the plurality of micro-structures 20 are configured to diffuse incident light and transmit the incident light to the flexible base 01. In some examples, the plurality of micro-structures 20 and the support plate body 101 are integrally formed. In some other examples, the plurality of micro-structures 20 and the support plate body 101 are separately formed.

Figure 2:
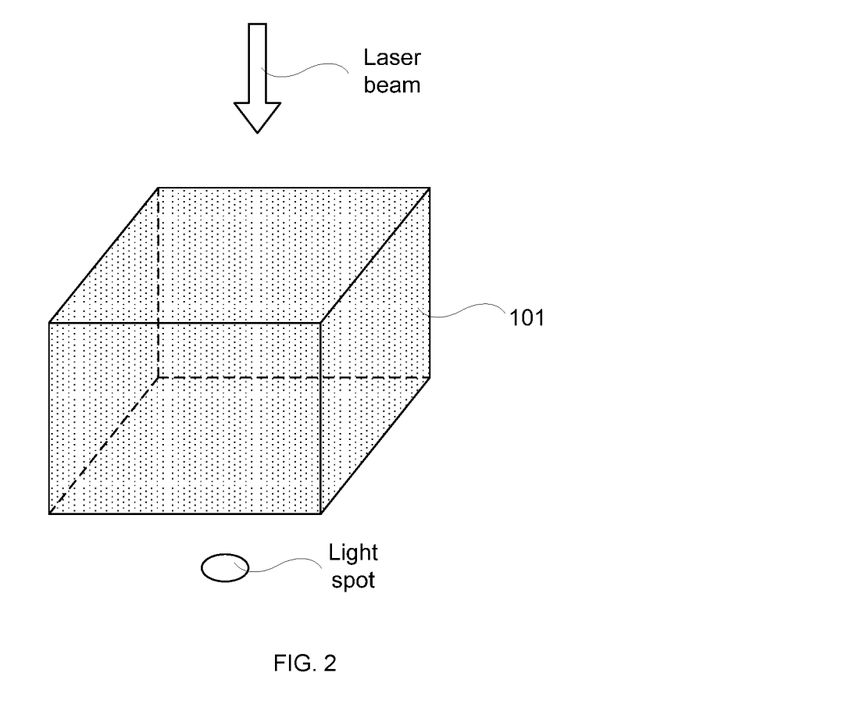
FIG. 2 is a schematic diagram showing an optical path of a laser beam passing through a support plate body, in accordance with some embodiments.

With reference to FIG. 2, in a process of separating the flexible base 01 from the base support plate 10 by the laser lift-off technique, if a laser beam is irradiated to the support plate body 101 on which no micro-structures 20 are disposed, a laser spot, which is formed by the laser beam after passing through the support plate body 101, has a smaller diameter. Then, with reference to FIG. 3, after the laser beam is irradiated to the support plate body 101 on which a plurality of micro-structures 20 are disposed (that is, the base support plate 10 provided by the embodiments of the present disclosure), the diameter of the laser spot, which is formed by the laser beam after passing through the base support plate 10, may become larger through diffusion effects of the micro-structures 20 on the laser beam, thereby ensuring that the laser beam incident on the flexible base 01 is more uniform.

In some embodiments, the plurality of micro-structures 20 are nanoscale micro-structures, which is advantageous for improving the diffusion effect of each micro-structure 20 on the incident light.

A structure of the plurality of micro-structures 20 will be described in detail below.

In some embodiments, as shown in FIG. 4, the plurality of micro-structures 20 are arranged in accordance with a structure of a one-dimensional grating. Here, the one-dimensional grating refers to that each micro-structure 20 is strip-shaped, and the plurality of micro-structures 20 are provided parallel to a same direction (for example, a Y direction) in a plane (for example, an XOY plane) where the support surface of the support plate body 101 is located, that is, the plurality of micro-structures 20 are arranged side by side in one direction (for example, an X direction). Of course, the shape of each micro-structure 20 in the one-dimensional grating is not limited thereto, as long as a dimension of any micro-structure 20 in the one-dimensional grating in one direction (for example, the Y direction) in the XOY plane is much larger than a dimension of the micro-structure 20 in the one-dimensional grating in another direction (for example, the X direction) in the XOY plane. For example, a dimension of each micro-structure 20 in the Y direction is the same as a dimension of the support plate body 101 in the Y direction, and a dimension of each micro-structure 20 in the X direction and a spacing between every two adjacent micro-structures 20 are nanoscale dimensions.

Moreover, in a case where a thickness (a dimension in a Z direction) of the base support plate 10 is ensured to satisfy production process requirements, some embodiments of the present disclosure do not limit the dimension of each micro-structure 20 in the Z direction (perpendicular to the XOY plane).

In some other embodiments, as shown in FIG. 5, the plurality of micro-structures 20 are arranged in an array. As shown in FIG. 5, each micro-structure 20 may be a cylinder or a cube or the like. In this case, in the plane (the XOY plane) where the support surface of the support plate body 101 is located, a dimension of each micro-structure 20 in the X direction and a dimension of the micro-structure 20 in the Y direction may be the same or different, but both are nanoscale dimensions. Moreover, in the case where the thickness (the dimension in the Z direction, the Z direction is perpendicular to the XOY plane) of the base support plate 10 is ensured to satisfy the production process requirements, some embodiments of the present disclosure do not limit the dimension of each micro-structure 20 in the Z direction.

In summary, the plurality of micro-structures 20 are disposed on the support surface of the support plate body 101, and the plurality of micro-structures 20 are used for diffusing an incident laser beam and transmitting a diffused laser beam to the flexible base 01 and the body member located on the side of the flexible base 01 facing away from the support plate body 101. In this case, even if an existence of an interval between adjacent laser pulses output from a laser source makes it difficult for a laser beam emitted from the laser source to uniformly scan the support plate body 101, a uniform scanning laser beam may be formed after a laser beam incident on the support plate body 101 is diffused by the plurality of micro-structures, so as to uniformly scan the flexible base 01 and the body member located on the side of the flexible base 01 facing away from the support plate body 101. That is, a uniform scanning laser beam may be formed after a laser beam incident on the support plate body 101 is diffused by the plurality of micro-structures, so that the amount of light that portions of the flexible base 01 and the TFTs in the body member located on the side of the flexible base 01 facing away from the support plate body 101 receive is substantially the same, thereby ensuring a uniformity of performance of the TFTs, and facilitating improving a display uniformity of the flexible display.

It will be noted that in some embodiments, orientation terms such as "upper" and "lower" are defined according to orientations in which the flexible base 01 is schematically placed in the drawings. It will be understood that these directional terms are relative concepts that are used for relative description and clarification, which may vary accordingly depending on the orientation in which the flexible base 01 is placed.

Figure 3:
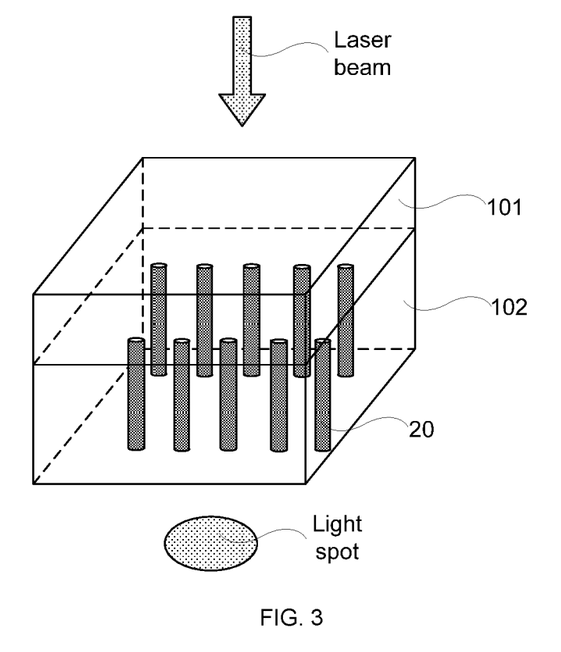
FIG. 3 is a schematic diagram showing an optical path of a laser beam passing through a base support plate, in accordance with some embodiments.

In some embodiments, with continued reference to FIG. 1, the base support plate 10 further includes a planarization layer 102 covering the plurality of micro-structures 20 and portions of the support surface of the support plate body 101 on which no micro-structures are located. A surface of the planarization layer 102 facing away from the support plate body 101 is configured to be in contact with the flexible base 01. As shown in FIG. 1 or 3, the planarization layer 102 may fill the gap between each two adjacent micro-structures 20. That is, the surface of the support plate body 101 on which the micro-structures 20 are disposed is planarized, so that a surface of the base support plate 10 in contact with the flexible base 01 has a high flatness, thereby improving an adhesion of the base support plate 10 to the flexible base 01, and preventing a problem of a detachment of the flexible base 01 from the base support plate 10 in a process of manufacturing the body member of the flexible display panel on the surface of the flexible base 01 facing away from the base support plate 10.

Figure 6:
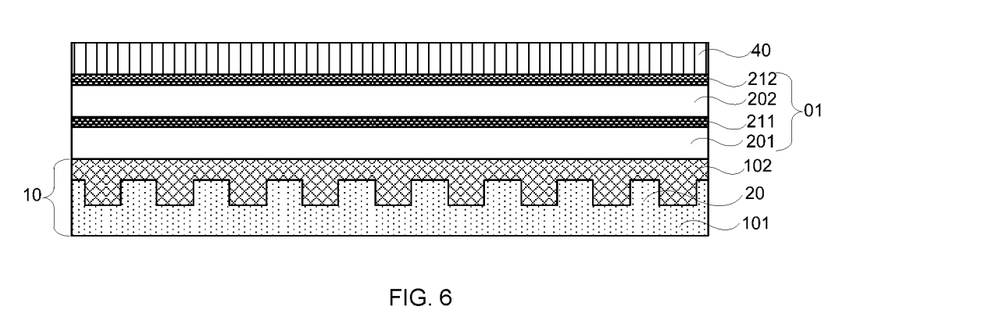
FIG. 6 is a schematic diagram of a base support plate on which a flexible display panel is supported, in accordance with some embodiments.

In some examples, the flexible base 01 includes a single organic thin film layer. Alternatively, as shown in FIG. 6, the flexible base 01 includes a plurality of thin film layers.

For example, the flexible base 01 includes a plurality of thin film layers, which include at least one inorganic thin film layer and at least one organic thin film layer. For example, as shown in FIG. 6, the plurality of thin film layers include a first organic film layer 201, a first inorganic film layer 211, a second organic film layer 202 and a second inorganic film layer 212 arranged in sequence in a direction away from the base support plate 10.

In some embodiments, materials for manufacturing the first organic thin film layer 201 and the second organic thin film layer 202 include polyimide. The first organic thin film layer 201 and the second organic thin film layer 202 constitute a main structure of the flexible base 01.

In some embodiments, materials for manufacturing the first inorganic thin film layer 211 and the second inorganic thin film layer 212 include at least one of silicon oxide (SiO₂) or silicon nitride (SiNx). The first inorganic thin film layer 211 and the second inorganic thin film layer 212 are capable of blocking water/oxygen to prevent water vapor or oxygen in air from entering the body member of the flexible display panel located on a side of the flexible base 01 facing away from the support plate body 101.

In some embodiments, a material of a thin film layer in the flexible base 01 in contact with the planarization layer 102 is different from a material of the planarization layer 102. For example, the first organic thin film layer 201 in the flexible base 01 is in contact with the planarization layer 102, both of which are made of different materials. As a result, in the process of separating the flexible base 01 from the base support plate 10 by the laser lift-off technique, a chemical bond between the planarization layer 102 and the thin film layer such as the first organic thin film layer 201 in the flexible base 01 in contact with the planarization layer 102 is easily broken under an action of the laser beam, thereby easily separating the flexible base 01 from the base support plate 10.

In some embodiments, a refractive index of the planarization layer 102 is less than a refractive index of the plurality of micro-structures 20. In some examples, an absolute value of a difference between the refractive index of the planarization layer 102 and the refractive index of the plurality of micro-structures 20 is in a range of 0.1 to 0.5. For example, the absolute value is 0.1, 0.2, 0.3, 0.4 or 0.5. In some examples, the plurality of micro-structures 20 and the support plate body 101 are integrally formed, and thus the plurality of micro-structures 20 and the support plate body 101 have the same refractive index. Since the refractive index of the planarization layer 102 is less than the refractive index of the plurality of micro-structures 20 or the support plate body 101, the planarization layer 102 is an optically thinner medium relative to the plurality of micro-structures 20 or the support plate body 101, and the plurality of micro-structures 20 or the support plate body 101 is an optically denser medium relative to the planarization layer 102. As a result, when the laser beam is incident from a side of the support plate body 101 facing away from the flexible base 01, the laser beam may be refracted during a transmission of the laser beam from the optically denser medium (the support plate body 101 and the plurality of micro-structures 20) to the optically thinner medium (the planarization layer 102), and a refraction angle is greater than an incident angle, so that a laser spot having a larger diameter, that is, a laser spot having a wider coverage, may be formed on a contact surface of the planarization layer 102 and the flexible base 01 after the laser beam passes through the planarization layer 102, thereby improving a scanning uniformity of the laser beam incident on the flexible base 01.

In some examples, the plurality of micro-structures 20 and the support plate body 101 are separately formed, and the refractive index of the plurality of micro-structures 20 is less than the refractive index of the support plate body 101. In this case, when the absolute value of the difference between the refractive index of the planarization layer 102 and the refractive index of plurality of micro-structures 20 is in a range of 0.1 to 0.5, the laser beam incident on the support plate body 101 may be refracted during a transmission of the laser beam from the optically denser medium to the optically thinner medium, and a refraction angle is greater than an incident angle, so that a laser spot having a larger diameter, that is, a laser spot having a wider coverage, may be formed on a contact surface of the planarization layer 102 and the flexible base 01 after the laser beam passes through the planarization layer 102, thereby improving a scanning uniformity of the laser beam incident on the flexible base 01.

Based on these embodiments, when the absolute value of the difference between the refractive index of the planarization layer 102 and the refractive index of the plurality of micro-structures 20 is less than 0.1, the difference between the refractive index of the plurality of micro-structures 20 and the refractive index of the planarization layer 102 is too small, which easily increases a difficulty in selecting materials for manufacturing the plurality of micro-structures 20 (or support plate body 101) and the planarization layer 102 and a difficulty of corresponding manufacturing processes. When the absolute value of the difference between the refractive index of the planarization layer 102 and the refractive index of the plurality of micro-structures 20 is greater than 0.5, the laser beam incident on the support plate body 101 may be greatly refracted at an interface between the plurality of micro-structures 20 and the planarization layer 102 during the transmission of the laser beam to the planarization layer 102, which easily causes a great change in a propagation direction of the laser beam after entering the planarization layer 102, thereby adversely affecting an accuracy and an effect of the laser lift-off process. Therefore, the absolute value of the difference between the refractive index of the planarization layer 102 and the refractive index of the plurality of micro-structures 20 is set in the range of 0.1 to 0.5, which may reduce adverse effects of the laser beam on the accuracy and the effect of the laser lift-off process due to a refraction on a basis of not increasing a difficulty of manufacturing the plurality of micro-structures 20 (or the support plate body 101) and the planarization layer 102.

It will be noted that some of the embodiments described above are merely illustrated by taking an example in which the base support plate 10 is configured to support the body member of the flexible display disposed on the side of the flexible base 01 facing away from the base support plate 10. Of course, in some other embodiments, the base support plate 10 is further configured to support other electronic components disposed on the side of the flexible base 01 facing away from the base support plate 10, such as an encapsulation chip or the like, which some embodiments of the present disclosure do not limit, but is included in the protection scope of the present disclosure.

Figure 7:
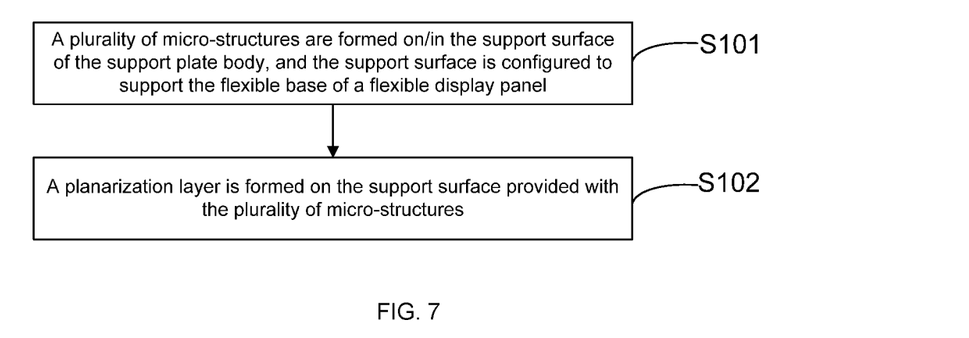
FIG. 7 is a flowchart depicting a method of manufacturing a base support plate, in accordance with some embodiments.

Some embodiments of the present disclosure provide a method of manufacturing a base support plate, and the method is used for manufacturing the based support plate 10 in some of the embodiments described above. With reference to FIGS. 1 and 7, the method of manufacturing the base support plate includes S101~S102.

In S101, a plurality of micro-structures 20 are formed on/in the support surface of the support plate body 101. The support surface is configured to support the flexible base 01 of the flexible display panel.

In some examples, the support plate body 101 is a rigid support plate, such as a glass support plate. Here, the support surface of the support plate body 101 is a surface of the support plate body 101 close to the flexible base 01 after the flexible base 01 is supported by the base support plate 10, and the term "on/in the support surface" refers to "on the support surface or in the support surface".

The process that a plurality of micro-structures 20 are formed on the support surface of the support plate body 101 refers to that the plurality of micro-structures 20 and the support plate body 101 are separately formed. For example, after the support plate body 101 is formed, a plurality of micro-structures 20 are formed on the support surface of the support plate body 101 directly. In some other examples, after the support plate body 101 is formed, a light-transmissive resin layer is formed on the support surface of the support plate body 101, and the light-transmissive resin layer is patterned through a patterning process so as to form a plurality of micro-structures 20 on the support surface 101 of the support plate body 101.

The process that a plurality of micro-structures 20 are formed in the support surface of the support plate body 101 refers to that after the support plate body 101 is formed, the support surface of the support plate body 101 is patterned through a patterning process, so as to form a plurality of micro-structures 20 in the support surface 101 of the support plate body 101. In this case, the plurality of micro-structures 20 and the support plate body 101 are integrally formed.

The S101, in which a plurality of micro-structures 20 are formed on/in the support surface of the support plate body 101, includes: forming a plurality of micro-structures on/in the support surface of the support plate body 101 through a patterning process including a nanoimprint process or a photoetching process.

In addition, according to a structure type of the plurality of micro-structures 20, the step 101, in which a plurality of micro-structures 20 are formed on/in the support surface of the support plate body 101, includes: forming a one-dimensional grating on/in the support surface of the support plate body 101, or, forming a plurality of cylindrical micro-structures or a plurality of cubic micro-structures arranged in an array on/in the support surface of the support plate body 101. Of course, the one-dimensional grating or the plurality of micro-structures arranged in an array described above are formed through the nanoimprint process or the photoetching process, or other processes.

For example, with reference to FIGS. 8A-8D, the step of forming a one-dimensional grating in the support surface of the support plate body 101 through the nanoimprint process is as follows.

Figure 8A:
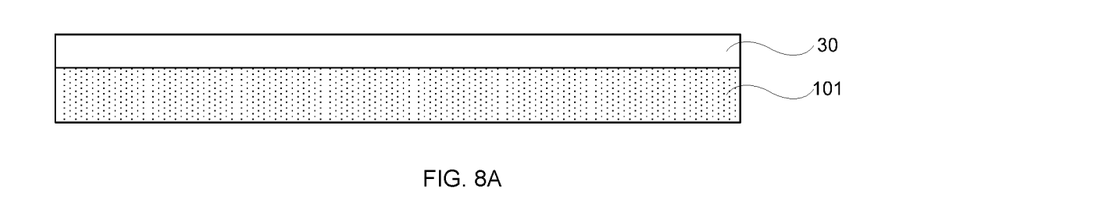
FIGS. 8A-8E are schematic diagrams showing structures during the implementation of a method of manufacturing a base support plate, in accordance with some embodiments.

First, as shown in FIG. 8A, an imprint resist layer 30 is formed on the support surface of the support plate body 101.

Figure 8B:
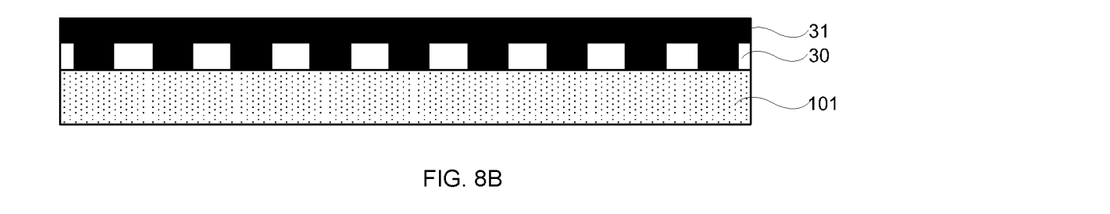

Then, as shown in FIG. 8B, the imprint resist layer 30 is imprinted by using a mold 31, so that portions of the imprint resist layer 30 each between any two adjacent portions of the mold 31 that are in contact with the support plate body 101 are extruded, that is, regions of the support surface of the support plate body 101 that are in contact with the mold 31 are not covered by the imprint resist.

Figure 8C:
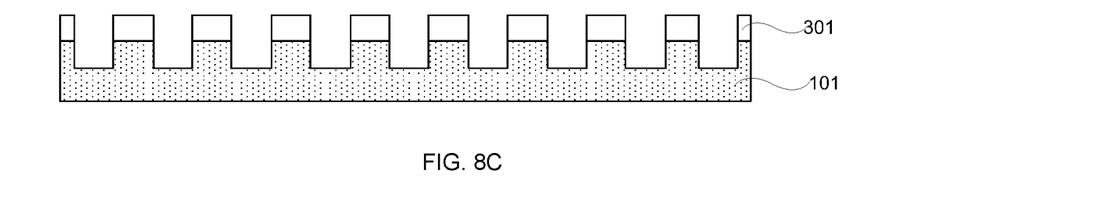

Then, as shown in FIG. 8C, portions of the support plate body 101 that are not covered by the remaining imprint resist 301 are etched through an etching process, and a plurality of strip-shaped grooves are formed in the support surface of the support plate body 101, so that portions of the support plate body 101 each disposed between two adjacent grooves constitute the plurality of micro-structures 20 described above, and the plurality of micro-structures 20 are present in a form of a one-dimensional grating.

Figure 8D:
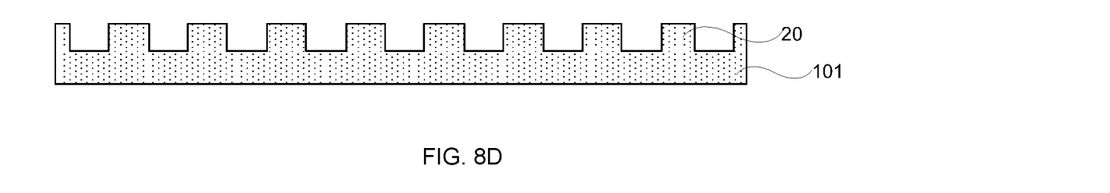

Finally, as shown in FIG. 8D, the remaining imprint resist 301 is removed (e.g., stripped) from the support plate body 101, and a manufacturing of the plurality of micro-structures 20 in the support plate body 101 may be completed.

It will be noted that some of dimensions of each micro-structure 20 formed through the nanoimprint process are nanoscale dimensions. For example, as shown in FIG. 4, in the one-dimensional grating composed of the plurality of micro-structures 20, the dimension of each micro-structure 20 in the X direction and the spacing between every two adjacent micro-structures 20 are nanoscale dimensions. For another example, as shown in FIG. 5, the plurality of cylindrical micro-structures 20 arranged in an array are formed through the nanoimprint process, and the dimensions of each micro-structure 20 in the X direction and in the Y direction are nanoscale dimensions.

The above description is made by taking an example in which the plurality of micro-structures 20 are formed through the nanoimprint process. In some embodiments, the plurality of micro-structures 20 may also be manufactured through the photoetching process. The photoetching process refers to a process including film formation, exposure, development, or the like, for forming a pattern by using a photoresist, a mask, an exposure machine, or the like, which some embodiments of the present disclosure do not limit.

In S102, a planarization layer 102 is formed on the support surface provided with the plurality of micro-structures 20 of the support plate body 101 to obtain a base support plate 10.

Figure 8E:
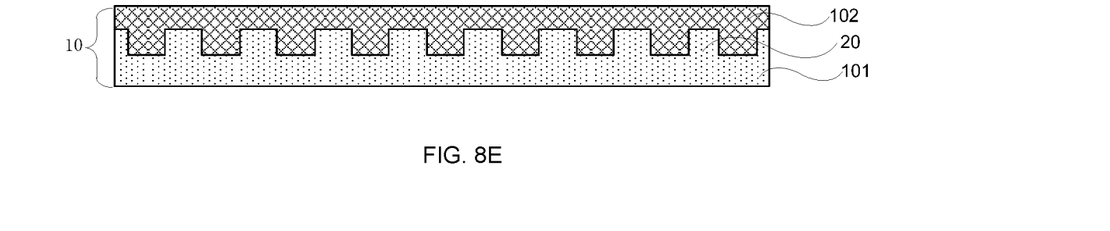

As shown in FIG. 8E, the planarization layer 102 covers the plurality of micro-structures 20 and portions of the support surface of the support plate body 101 that are not covered by the micro-structures 20, and the planarization layer may fill the gap between each two adjacent micro-structures 20. That is, the surface of the support plate body 101 on which the micro-structures 20 are disposed is planarized, so that the surface of the base support plate 10 configured to be in contact with the flexible base 01 has a high flatness, thereby improving the adhesion of the base support plate 10 to the flexible base 01.

In some embodiments, the S102, in which a planarization layer 102 is formed on the support surface provided with the plurality of micro-structures 20 of the support plate body 101, includes: forming a planarization layer 102 on the support surface provided with the plurality of micro-structures 20 of the support plate body 101 through the film forming process by using a light-transmissive material different from a material of a thin film layer in the flexible base 01 configured to be in contact with the base support plate 10 (i.e., the planarization layer 102). That is, the planarization layer 102 is formed through the film forming process, and the light-transmissive material is different from the material of the thin film layer in the flexible base 01 configured to be in contact the planarization layer 102, so that the flexible base 01 may be easily separated from the planarization layer 102 of the base support plate 10.

In some embodiments, the S102, in which a planarization layer 102 is formed on the support surface provided with the plurality of micro-structures 20 of the support plate body 101 includes: forming a planarization layer 102 on the support surface provided with the plurality of micro-structures 20 of the support plate body 101 by using a light-transmissive material having a refractive index less than a refractive index of the plurality of micro-structures 20. In this way, the refractive index of the planarization layer 102 is less than the refractive index of the plurality of micro-structures 20, so that a laser spot having a larger diameter, that is, a laser spot having a wider coverage, may be formed on a contact surface of the planarization layer 102 and the flexible base 01 after the laser beam passes through the planarization layer 102, thereby improving a scanning uniformity of the laser beam incident on the flexible base 01.

Beneficial effects of the method of manufacturing the base support plate provided by some embodiments of the present disclosure are the same as the beneficial effects of the base support plate provided by some of the embodiments described above, which are not described herein again.

Figure 9:
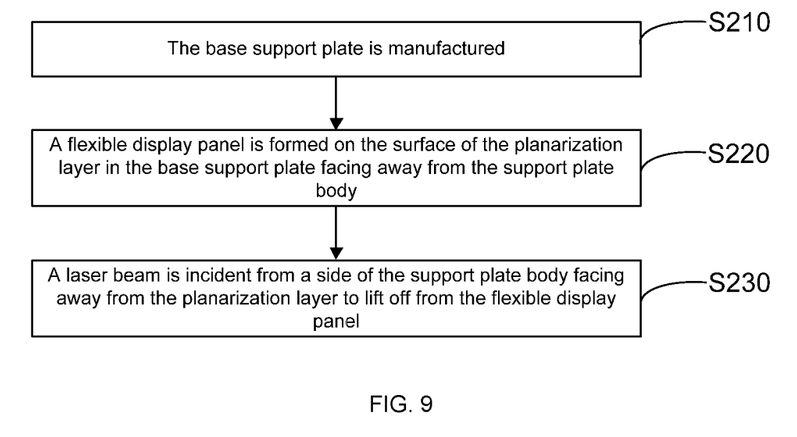
FIG. 9 is a flowchart depicting a method of manufacturing a flexible display panel, in accordance with some embodiments.
Figure 10:
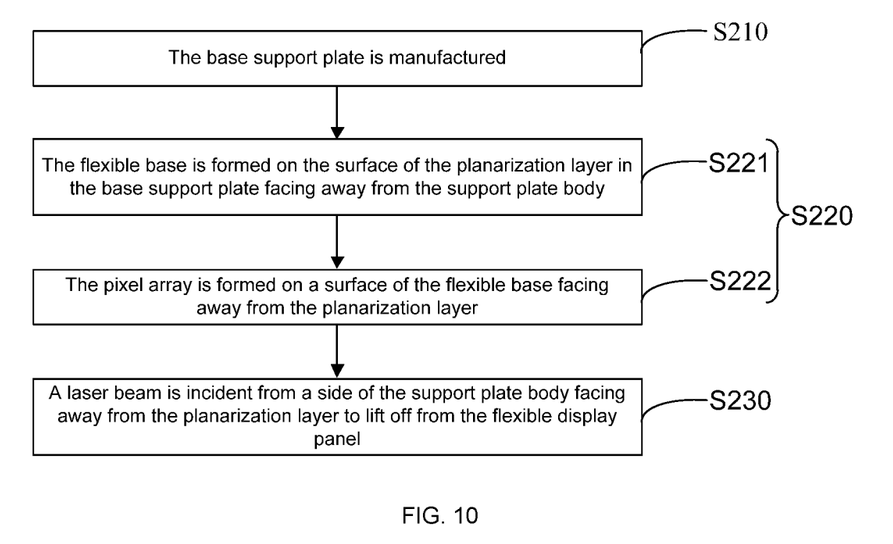
FIG. 10 is a flowchart depicting a method of manufacturing another flexible display panel, in accordance with some embodiments.
Figure 11:
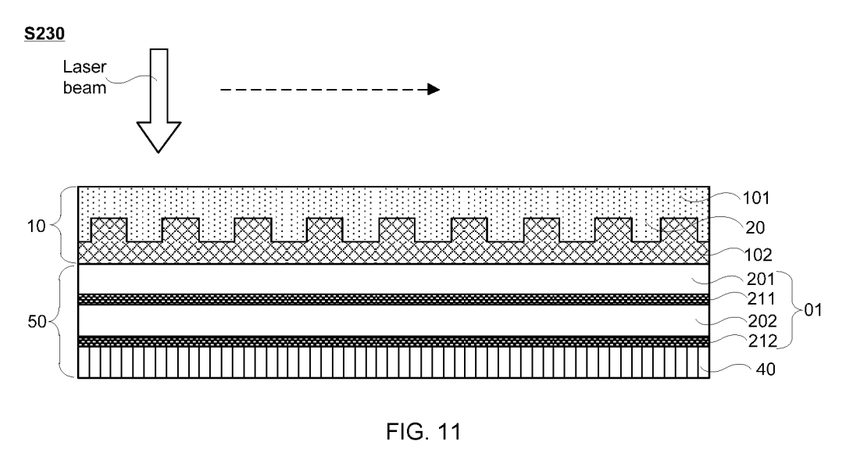
FIG. 11 is a schematic diagram showing a process of separating a flexible display panel from a base support plate by a laser lift-off technique, in accordance with some embodiments.
Figure 12:
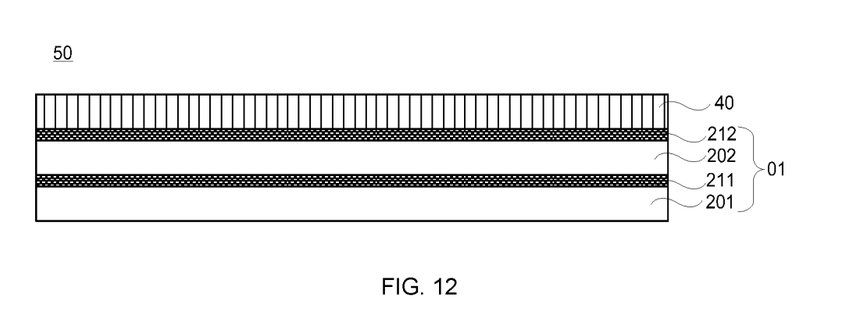
FIG. 12 is a schematic diagram of a flexible display panel, in accordance with some embodiments.

Some embodiments of the present disclosure provide a method of manufacturing a flexible display panel. With reference to FIGS. 9, 10 and 11, the method of manufacturing the flexible display panel includes S210 to S230.

In S210, the base support plate 10 is manufactured by using the method of manufacturing the base support plate 10 in some of the embodiments described above. The base support plate 10 includes a support plate body 101, a plurality of micro-structures 20 disposed on the support surface of the support plate body 101 and a planarization layer 102 covering the plurality of micro-structures 20 and portions of the support surface of the support plate body 101 on which no micro-structures are located.

In S220, a flexible display panel 50 is formed on the surface of the planarization layer 102 in the base support plate 10 facing away from the support plate body 101.

In S230, a laser beam is incident from a side of the support plate body 101 facing away from the planarization layer 102 to lift off the base support plate 10 from the flexible display panel 50. The manufacturing of the flexible display panel may be completed.

As shown in FIG. 11, a laser beam emitted from the laser source is uniformly scanned in one direction (a direction of a dotted arrow) on the side of the support plate body 101 facing away from the planarization layer 102, for example, the base support plate 10 on which the flexible display panel 50 is formed is irradiated from left to right or from right to left. In this way, the laser beam incident on the support plate body 101 may be diffused under an action of the plurality of micro-structures 20, and the diffused laser beam is transmitted to the flexible display panel 50, so that each region of the flexible display panel 50 uniformly receives the laser beam, thereby facilitating improving a display uniformity of the flexible display panel.

It will be understood that the flexible display panel 50 usually includes a flexible base 01, a pixel array 40 disposed on the flexible base 01 and external leads disposed corresponding to the pixel array 40 or the like. In some embodiments, with continued reference to FIGS. 9 and 10, S220 includes S221 and S222.

In S221, the flexible base 01 is formed on the surface of the planarization layer 102 in the base support plate 10 facing away from the support plate body 101.

For example, as shown in FIG. 11, the flexible base 01 includes a first organic thin film layer 201, a first inorganic thin film layer 211, a second organic thin film layer 202 and a second inorganic thin film layer 212 disposed in sequence. Accordingly, the S221 includes: forming a first organic thin film layer 201, a first inorganic thin film layer 211, a second organic thin film layer 202 and a second inorganic thin film layer 212 on the surface of the planarization layer 102 facing away from the support plate body 101 in sequence through the film forming process. The film forming process for forming the first organic thin film layer 201 and the second organic thin film layer 202 includes a vacuum coating process, and the film forming process for forming the first inorganic thin film layer 211 and the second inorganic thin film layer 212 includes a coating process.

Optionally, the materials for manufacturing the first organic thin film layer 201 and the second organic thin film layer 202 include polyimide, and the materials for manufacturing the first inorganic thin film layer 211 and the second inorganic thin film layer 212 include at least one of silicon oxide ($SiO_2$) or silicon nitride ($SiN_x$).

In S222, the pixel array 40 is formed on a surface of the flexible base 01 facing away from the planarization layer 102. Each pixel of the pixel array 40 includes a light-emitting device and a pixel circuit coupled to the light-emitting device. Each pixel circuit includes at least one TFT, and is configured to drive a corresponding light-emitting device to emit light. Of course, the external leads disposed corresponding to the pixel array 40 are also usually formed on the flexible base 01 to input signals to the light-emitting device and the pixel circuit in each pixel.

Moreover, in some embodiments, the flexible display panel further includes an encapsulation film layer or a cover plate or the like configured to encapsulate each light-emitting device in the pixel array 40. Based on this, before lifting off the flexible display panel by using the laser beam (S230), S220 further includes: forming an encapsulation film layer or a cover plate on a side of the pixel array 40 facing away from the flexible base 01.

In the description of the above embodiments, specific features, structures, materials or characteristics may be combined in any suitable manner in any one or more embodiments or examples.

The foregoing descriptions are merely specific implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A base support plate, comprising:
   a support plate body, wherein a support surface of the support plate body is configured to support a flexible base of a flexible display panel; and
   a plurality of micro-structures disposed on the support surface of the support plate body, wherein the plurality of micro-structures are configured to diffuse incident light and transmit the incident light to the flexible base;
   a planarization layer covering the plurality of micro-structures and portions of the support surface on which no micro-structures are located, and a surface of the planarization layer facing away from the support plate body is configured to be in contact with the flexible base, wherein
   the planarization layer is configured to be separable from the flexible base to make the base support plate separate from the flexible base;
   a material of the planarization layer is configured to be different from a material of the flexible base;
   a refractive index of the planarization layer is less than a refractive index of the plurality of micro-structures;
   an absolute value of a difference between the refractive index of the planarization layer and the refractive index of the plurality of micro-structures is in a range of 0.1 to 0.5;
   the refractive index of the plurality of micro-structures is equal to a refractive index of the support plate body; and
   the plurality of micro-structures and the support plate body are integrally formed.

2. The base support plate according to claim 1, wherein the plurality of micro-structures constitute a one-dimensional grating.

3. The base support plate according to claim 1, wherein the plurality of micro-structures are arranged in an array.

4. The base support plate according to claim 3, wherein each of the plurality of micro-structures includes a cylinder or a cube.

5. The base support plate according to claim 1, wherein the support plate body includes a glass support plate.

6. A method of manufacturing the base support plate according to claim 1, the method comprising:
   forming the plurality of micro-structures in the support surface of the support plate body;
   forming the planarization layer on the support surface provided with the plurality of micro-structures;
   wherein forming the plurality of micro-structures in the support surface of the support plate body, includes:
   forming the plurality of micro-structures in the support surface of the support plate body through a patterning process, wherein the patterning process includes a nanoimprint process or a photoetching process;
   wherein forming the planarization layer on the support surface provided with the plurality of micro-structures, includes:
   forming the planarization layer on the support surface provided with the plurality of micro-structures through a film forming process by using a light-transmissive material different from a material of the flexible base and having the refractive index less than the refractive index of the plurality of micro-structures.

7. The method of manufacturing the base support plate according to claim 6, wherein forming the plurality of micro-structures in the support surface of the support plate body, further includes:
   forming a one-dimensional grating in the support surface of the support plate body; or
   forming a plurality of cylindrical micro-structures or a plurality of cubic micro-structures arranged in an array in the support surface of the support plate body.

8. A method of manufacturing a flexible display panel, the method comprising:
   manufacturing a base support plate by using the method of manufacturing the base support plate according to claim 6;
   forming a flexible display panel on a surface of the planarization layer in the base support plate facing away from the support plate body; and
   incidenting a laser beam from a side of the support plate body facing away from the planarization layer to separate the base support plate from the flexible display panel.

9. The method of manufacturing the flexible display panel according to claim 8, wherein forming the flexible display panel on the surface of the planarization layer in the base support plate facing away from the support plate body, includes:
   forming the flexible base on the surface of the planarization layer in the base support plate facing away from the support plate body; and
   forming a pixel array on a surface of the flexible base facing away from the planarization layer.

10. The method of manufacturing the flexible display panel according to claim 9, wherein forming the flexible base on the surface of the planarization layer in the base support plate facing away from the support plate body, includes:
    forming a first organic thin film layer, a first inorganic thin film layer, a second organic thin film layer and a second inorganic thin film layer on the surface of the planarization layer facing away from the support plate body in sequence through a film forming process.

11. The method of manufacturing the flexible display panel according to claim 10, wherein
    materials for manufacturing the first organic thin film layer and the second organic thin film layer include polyimide; and
    materials for manufacturing the first inorganic thin film layer and the second inorganic thin film layer include at least one of silicon oxide or silicon nitride.

* * * * *